United States Patent [19]
Akiya

[11] Patent Number: 5,998,962
[45] Date of Patent: Dec. 7, 1999

[54] APPARATUS FOR DISCRIMINATING PRIMARY AND SECONDARY BATTERIES

[75] Inventor: Makoto Akiya, Saitama, Japan

[73] Assignee: NEC Corporation, Tokyo, Japan

[21] Appl. No.: 09/096,002

[22] Filed: Jun. 11, 1998

[30] Foreign Application Priority Data

Jun. 11, 1997 [JP] Japan .................................. 9-154133

[51] Int. Cl.$^6$ ............................................... H01M 10/46
[52] U.S. Cl. .................................................. 320/106
[58] Field of Search .................................. 320/106, 110, 320/132, FOR 102, FOR 105, FOR 114, FOR 147

[56] References Cited

U.S. PATENT DOCUMENTS

| | | | |
|---|---|---|---|
| 4,577,144 | 3/1986 | Hodgman et al. | 320/106 |
| 4,577,145 | 3/1986 | Mullersman | 320/106 |
| 5,438,248 | 8/1995 | Hyuck . | |
| 5,600,224 | 2/1997 | Mody et al. | 320/106 |
| 5,847,539 | 12/1998 | Akiya | 320/106 |

FOREIGN PATENT DOCUMENTS

| | | |
|---|---|---|
| 0 637 119A2 | 2/1995 | European Pat. Off. . |
| 2 275 139 | 8/1994 | United Kingdom . |
| 2 315 619 | 2/1998 | United Kingdom . |

Primary Examiner—Edward H. Tso
Attorney, Agent, or Firm—Scully, Scott Murphy & Presser

[57] ABSTRACT

In a portable electronic equipment usable with both primary and secondary batteries, discrimination between primary and secondary batteries is carried out utilizing a difference in discharge characteristics between the primary and secondary batteries. Specifically, a previously acquired battery voltage is compared with a battery voltage after a given period of time, and whether the battery is a primary battery or a secondary battery is determined based on the voltage difference. Charging operation is controlled based on the discrimination results, enabling the secondary battery to be more surely charged.

4 Claims, 3 Drawing Sheets

APPARATUS FOR DISCRIMINATING PRIMARY AND SECONDARY BATTERIES

FIELD OF THE INVENTION

The invention relates to an apparatus for discriminating primary and secondary batteries that can determine whether the battery contained and loaded in a portable communication equipment is a primary battery or a secondary battery.

BACKGROUND OF THE INVENTION

A conventional apparatus for discriminating primary and secondary batteries is disclosed in Japanese Patent Application No. 187849/1996. In this conventional apparatus, discrimination between primary and secondary batteries is carried out based on whether voltage is present in a discriminating terminal.

In the conventional apparatus for discriminating the primary and secondary batteries, however, there is a disadvantage in that, since the discrimination is always performed based on whether or not voltage is present in the battery discriminating terminal, in some cases, the secondary battery cannot be recharged.

This is because when the residual capacity of the primary battery has become zero, the voltage of the battery discriminating terminal also becomes zero, causing such erroneous discrimination that, even when the loaded battery is a primary battery, the battery is erroneously regarded as the secondary battery.

SUMMARY OF THE INVENTION

Accordingly, it is an object of the invention to provide an apparatus for discriminating primary and secondary batteries that can correctly discriminate between primary and secondary batteries and, even when the residual capacity of the secondary battery has become zero, the secondary battery can be surely recharged. According to the first feature of the invention, an apparatus for discriminating primary and secondary batteries in a portable communication equipment using a primary or secondary battery pack as a power supply, comprises:

a memory for storing the voltage of the battery pack at the start of use thereof of the portable communication equipment;

a subtracter for determining a difference between the voltage stored in the memory and the voltage of the battery pack after use of the portable communication equipment for a predetermined period of time;

a comparator for comparing a threshold value, for discrimination between the batteries with the voltage difference to determine whether the loaded battery is a primary battery or a secondary battery; and a switch which, when the output from the comparator has informed that the battery is a secondary battery, permits the battery to be recharged and, when the output from the comparator has informed that the battery is a primary battery, renders a recharging operation invalid.

In the preferred embodiment, when the voltage difference is smaller than the threshold voltage, the loaded battery is regarded as a secondary battery, while when the voltage difference is larger than the threshold voltage, the loaded battery is regarded as a primary battery.

According to the second feature of the invention, an apparatus for discriminating primary and secondary batteries in a portable communication equipment using a primary or secondary battery as a power supply, comprises:

battery voltage measuring means;

time measuring means for measuring the service time taken from the start of use of the portable communication equipment to the drop of the battery voltage to a charge initiation voltage;

a comparator for comparing a threshold time value, for discrimination between the batteries, with the service time to determine whether the loaded battery is a primary battery or a secondary battery; and a switch which, when the output from the comparator has informed that the battery is a secondary battery, permits the battery to be recharged and, when the output from the compactor has informed that the battery is a primary battery, renders a recharging operation invalid.

In the preferred embodiment, when the service time value is smaller than the threshold time value, the loaded battery is regarded as a primary battery, while when the service time value is larger than the threshold time value, the loaded battery is regarded as a secondary battery.

BRIEF DESCRIPTION OF THE DRAWINGS

The invention will be explained in more detail in conjunction with appended drawings, wherein.

DESCRIPTION OF THE PREFERRED EMBODIMENTS

Before explaining an apparatus for discriminating primary and secondary batteries, the aforementioned conventional apparatus for discriminating primary and secondary batteries will be explained in FIGS. 1A and 1B.

Figure 1A:
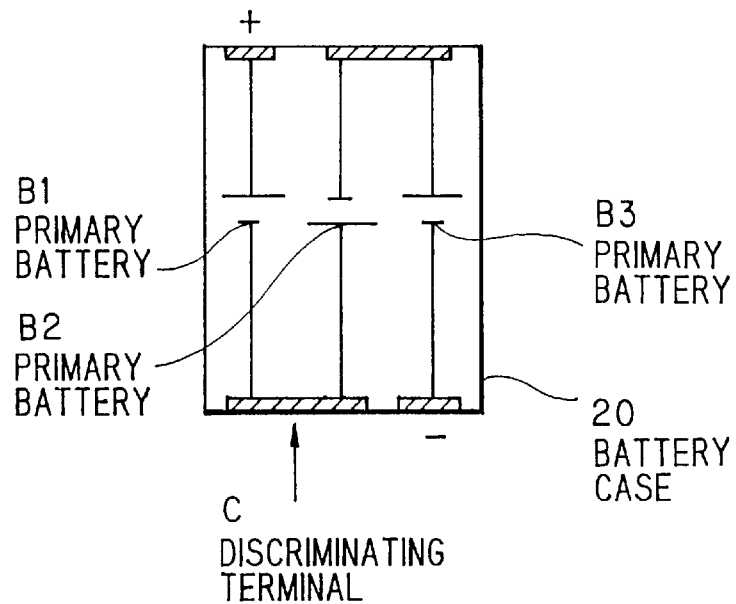
FIG. 1 is a block diagram showing the construction of a conventional apparatus for discriminating primary and secondary batteries.
Figure 1B:
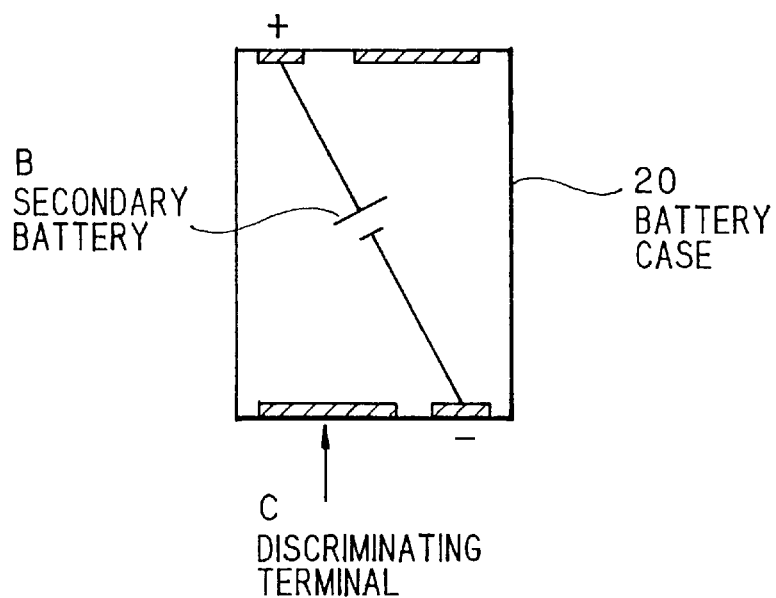

In FIGS. 1A and 1B, a discriminating terminal C is provided in a battery case 20 of a portable communication equipment. When a primary battery is used, a battery pack constituted by three unit cells B1, B2, and B3 is set as shown in FIG. 1A. This permits voltage to be applied to the discriminating terminal C. On the other hand, when a secondary battery is used, as shown in FIG. 1B, a battery B is connected between a positive electrode and a negative electrode, so that no voltage is applied to the discriminating terminal C.

Thus, in the conventional apparatus for discriminating primary and secondary batteries, discrimination between primary and secondary batteries is always carried out based on whether or not voltage is applied to the discriminating terminal C, thereby always controlling a charging circuit.

Next, an apparatus for discriminating primary and secondary batteries in the preferred embodiment according to the invention will be explained.

Figure 2:
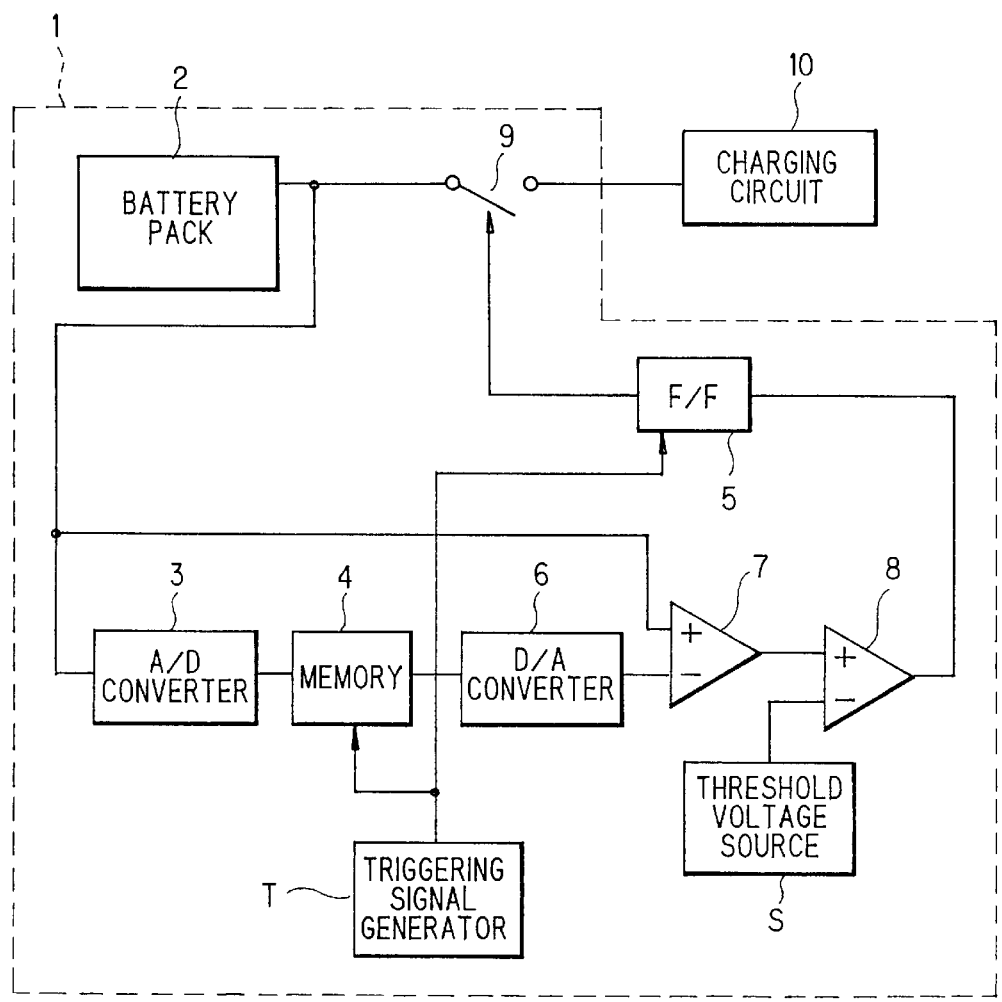
FIG. 2 is a block diagram showing the construction of an apparatus for discriminating primary and secondary batteries according to a preferred embodiment of the invention.

FIG. 2 shows the construction of an apparatus for discriminating primary and secondary batteries according to a preferred embodiment of the invention.

In this drawing, in an apparatus 1 for discriminating primary and secondary batteries, contained in a portable communication equipment, a battery pack 2 is loaded with a primary battery or a secondary battery. An A/D converter 3 converts voltage output from the battery pack 2 to digital data, and the digital data are stored in a memory 4 to hold data.

The digital data output from the memory 4 is converted by a D/A converter 6 to analog data. In a subtracter 7, voltage data output from the battery pack 2 after the elapse of a predetermined period of time are subtracted from the data output from the D/A converter 6, and the calculated value obtained in the subtracter 7 is compared with a battery discriminating threshold voltage provided from a threshold voltage source S by a comparator 8 to determine whether the battery used in the portable communication equipment is a primary battery or a secondary battery.

A flip-flop 5 latches a battery discriminating signal, output from the comparator 8, by trigger timing given from a trigger signal generator T that, when the equipment is used for a predetermined period of time, generates a trigger signal. The output from the flip-flop 5 closes or opens switch 9.

A charging circuit 10 is provided outside the apparatus 1 for discriminating primary and secondary batteries. When the battery pack 2 is a secondary battery, the charging circuit 10 serves to charge the secondary battery from the outside of the apparatus 1.

Next, the operation of the apparatus, for discriminating primary and secondary batteries, having the above construction will be explained with reference to FIG. 3.

Figure 3:
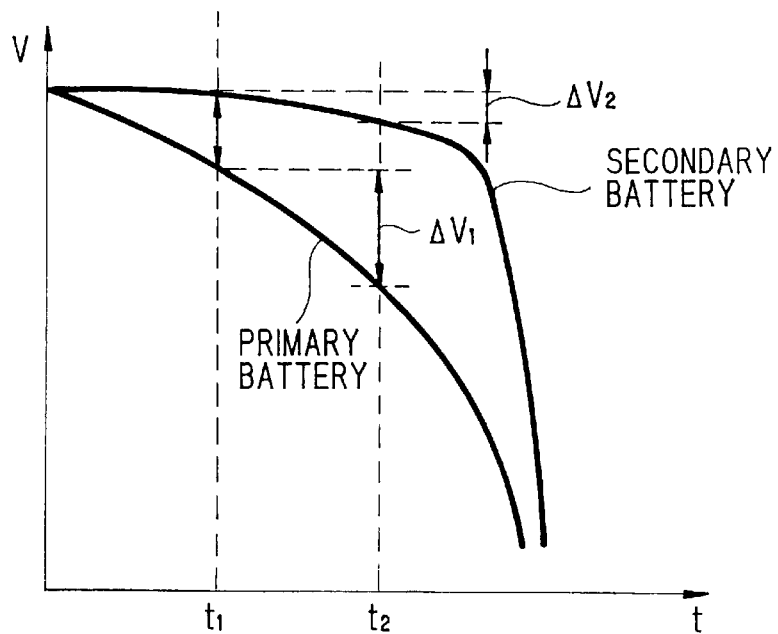
FIG. 3 is a diagram showing battery voltage characteristics for explaining the operation of an apparatus for discriminating primary and secondary batteries according to a preferred embodiment of the invention.

The battery voltage output from the battery pack 2, that is, the voltage value at time t1 shown in FIG. 3, is incorporated into the A/D converter 3 where it is converted to digital data which are then stored in the memory 4.

The trigger signal generator T cumulates the service time of the portable communication equipment and, when the cumulated time exceeds a predetermined time and reaches time t2 shown in FIG. 3, generates a trigger signal to output the digital data stored in the memory 4.

The digital data are converted by the D/A converter 6 to analog voltage data, and the battery voltage output from the battery pack 2 is subtracted from the analog voltage data by the subtracter 7.

The voltage drop $\Delta V1$ of the primary battery, due to the use of the portable communication equipment, in the period of time (t2–t1) is larger than the voltage drop $\Delta V2$ of the secondary battery in the same period of service time. Therefore, bringing the voltage provided by the threshold voltage source S to a value intermediate between $\Delta V1$ and $\Delta V2$ enables discrimination between primary and secondary batteries, that is, makes it possible to determine whether the battery being used is a primary battery or a secondary battery.

The output from the comparator 8, i.e., the result of discrimination between primary and secondary batteries, is latched by the flip-flop 5 at timing of time t2 shown in FIG. 3, and the output of the flip-flop 5 opens or closes the switch 9.

When the discrimination result is such that the battery is a primary battery, the switch 9 is "opened," disengaging the charging circuit 10, while when the discrimination result is such that the battery is a secondary battery, the switch 9 is "closed" to connect the charging circuit 10, making it possible to conduct recharging of the battery.

The operation of the apparatus for discriminating primary and secondary batteries according to a preferred embodiment of the invention has been described in detail with reference to the accompanying drawings. The invention, however, is not limited to this embodiment only, and a change of design not derived from the subject matter of the invention falls within the scope of the invention.

Figure 4:
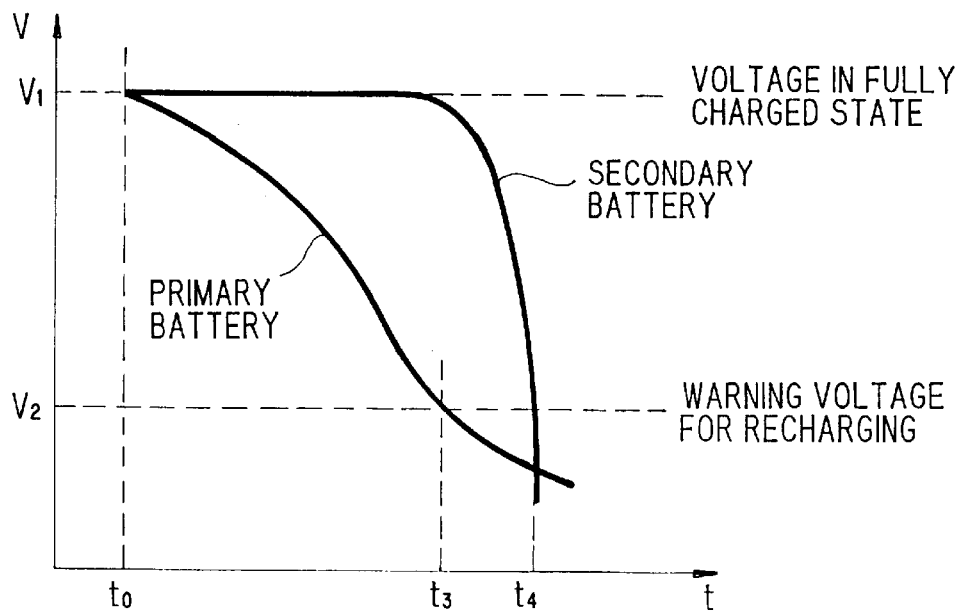
FIG. 4 is a diagram showing battery voltage characteristics for explaining the operation of an apparatus for discriminating primary and secondary batteries according to another preferred embodiment of the invention.

For example, as shown in FIG. 4, when the time between the time t0 (output voltage of the battery: V1), at which use of the portable communication equipment starts, and the battery voltage drops to the warning voltage V2 for recharging, that is, the time (t3–t0) or the time (t4–t0), is measured, the time for the primary battery is shorter than the time for the secondary battery. Therefore, a time value intermediate between these times may be used as a threshold time value for the discrimination between primary and secondary batteries.

As is apparent from the foregoing description, according to the present invention, unlike the prior art technique wherein discrimination between primary and secondary batteries is always carried out. discrimination between primary and secondary batteries is carried out after the elapse of a predetermined time after loading of the battery and is completed before the residual capacity of the battery becomes zero, enabling the discrimination to be surely carried out. Therefore, even though the residual capacity of the secondary battery becomes zero, discrimination between primary and secondary batteries can be correctly carried out and the recharging operation can be initiated.

The invention has been described in detail with particular reference to preferred embodiments, but it will be understood that variations and modifications can be effected within the scope of the present invention as set forth in the appended claims.

What is claimed is:

1. An apparatus for discriminating primary and secondary batteries in a portable communication equipment using a primary or secondary battery pack as a power supply, said apparatus comprising:

battery voltage measuring means;

wherein the battery pack supplies power to the portable communication equipment for a predetermined period of time, during which the operating voltage supplied by the battery pack drops from an initial charged voltage V1 at time t1 to a lower partially discharged voltage V2 at time t2 after the predetermined period of time;

a memory for storing the voltage V1 of the battery pack at the start of use of the portable communication equipment at the time t1;

a subtracter for determining a difference between the voltage V1 stored in the memory and the voltage V2 of the battery pack after use of the portable communication equipment for the predetermined period of time;

a comparator for comparing a threshold value, for discrimination between the batteries, with the voltage difference to determine whether the loaded battery is a primary battery or a secondary battery; and a switch which, when the output from the comparator has informed that the battery is a secondary battery, permits the battery to be recharged and, when the output from the comparator has informed that the battery is a primary battery, renders a recharging operation invalid.

2. The apparatus according to claim 1, wherein, when the voltage difference is smaller than the threshold voltage, the loaded battery is regarded as a secondary battery, while when the voltage difference is larger than the threshold voltage, the loaded battery is regarded as a primary battery.

3. An apparatus for discriminating primary and secondary batteries in a portable communication equipment using a primary or secondary battery as a power supply, said apparatus comprising:

battery voltage measuring means;

wherein the battery pack supplies power to the portable communication equipment over a service time period, during which the operating voltage supplied by the battery pack drops from an initial charged voltage at time t1 to a lower charge initiation voltage at time t2 over the service time period;

time measuring means for measuring the service time taken from the start of use of the portable communication equipment at time t1 to the drop of the battery voltage to the charge initiation voltage at time t2;

a comparator for comparing a threshold time value, for discrimination between the batteries, with the service time to determine whether the loaded battery is a primary battery or a secondary battery; and a switch which, when the output from the comparator has informed that the battery is a secondary battery, permits the battery to be recharged and, when the output from the comparator has informed that the battery is a primary battery, renders a recharging operation invalid.

4. The apparatus according to claim 3, wherein, when the service time value is smaller than the threshold time value, the loaded battery is regarded as a primary battery, while when the service time value is larger than the threshold time value, the loaded battery is regarded as a secondary battery.

* * * * *